United States Patent
Sasaki et al.

(10) Patent No.: US 10,156,010 B2
(45) Date of Patent: Dec. 18, 2018

(54) COATED CUTTING TOOL AND METHOD FOR PRODUCING THE SAME

(71) Applicants: HITACHI METALS, LTD., Minato-ku, Tokyo (JP); Mitsubishi Hitachi Tool Engineering,Ltd., Sumida-ku, Tokyo (JP)

(72) Inventors: Tomoya Sasaki, Yasugi (JP); Kenichi Inoue, Narita (JP)

(73) Assignees: HITACHI METALS, LTD., Tokyo (JP); Mitsubishi Hitachi Tool Engineering, Ltd., Tokyo (JP)

( * ) Notice: Subject to any disclaimer, the term of this patent is extended or adjusted under 35 U.S.C. 154(b) by 134 days.

(21) Appl. No.: 15/125,969

(22) PCT Filed: Mar. 18, 2015

(86) PCT No.: PCT/JP2015/058116
§ 371 (c)(1),
(2) Date: Sep. 14, 2016

(87) PCT Pub. No.: WO2015/141743
PCT Pub. Date: Sep. 24, 2015

(65) Prior Publication Data
US 2017/0096733 A1    Apr. 6, 2017

(30) Foreign Application Priority Data
Mar. 18, 2014   (JP) ................. 2014-055563

(51) Int. Cl.
*C23C 14/08*   (2006.01)
*C23C 14/06*   (2006.01)
(Continued)

(52) U.S. Cl.
CPC ...... *C23C 14/0664* (2013.01); *C23C 14/0641* (2013.01); *C23C 14/325* (2013.01);
(Continued)

(58) Field of Classification Search
USPC .......... 51/307, 309; 428/217, 697, 698, 699; 204/192.11, 192.12, 192.15
See application file for complete search history.

(56) References Cited

U.S. PATENT DOCUMENTS 6,824,601 B2 * 11/2004 Yamamoto .......... C23C 14/0641
                                                                204/192.15
7,166,155 B2 *  1/2007 Ishikawa ................ C23C 14/06
                                                                428/699

(Continued)

FOREIGN PATENT DOCUMENTS

EP      1422311 A2    5/2004
EP      1500717 A1    1/2005
(Continued)

OTHER PUBLICATIONS

Extended European Search Report dated Sep. 21, 2017, issued in corresponding EP Patent Application No. 15764674.6.

*Primary Examiner* — Archene A Turner
(74) *Attorney, Agent, or Firm* — Solaris Intellectual Property Group, PLLC (57) ABSTRACT

An embodiment of the invention provides a coated cutting tool having a base material and a hard coating, in which: the hard coating is formed from a nitride or a carbonitride having an Al content of from 50 at. % to 68 at. %, a Cr content of from 20 at. % to 46 at. %, and an Si content of from 4 at. % to 15 at. %, relative to the total amount of metal (including semimetal) elements, and when the total of metal (including semimetal) elements, nitrogen, oxygen, and carbon is designated as 100 at. %, the atomic percentage (at. %) A of metal (including semimetal) elements and the atomic percentage (at. %) B of nitrogen satisfy the relationship $1.03 \leq B/A \leq 1.07$; and, in an intensity profile obtained from an X-ray diffraction pattern or a selected area diffraction pattern of a transmission electron microscope, an intensity of a peak (Continued)

from the (200) plane or the (111) plane of a face-centered cubic lattice structure exhibits the maximum intensity.

13 Claims, 4 Drawing Sheets

(51) Int. Cl.
  *C23C 14/34* (2006.01)
  *C23C 14/32* (2006.01)
  *C23C 28/04* (2006.01)
  *C23C 30/00* (2006.01)

(52) U.S. Cl.
  CPC ........ *C23C 14/3414* (2013.01); *C23C 28/042* (2013.01); *C23C 28/044* (2013.01); *C23C 30/005* (2013.01)

(56) References Cited

U.S. PATENT DOCUMENTS

| | | | |
|---|---|---|---|
| 8,017,226 B2* | 9/2011 | Yamamoto | C23C 14/022 428/697 |
| 2006/0154108 A1* | 7/2006 | Fukui | C23C 30/005 428/698 |
| 2008/0229891 A1* | 9/2008 | Lechthaler | C23C 14/0641 428/457 |
| 2012/0090247 A1* | 4/2012 | Miura | C23C 14/0036 51/309 |

FOREIGN PATENT DOCUMENTS

| | | |
|---|---|---|
| JP | 2002-337007 A | 11/2002 |
| JP | 2004-337988 A | 12/2004 |
| JP | 2005-126736 A | 5/2005 |
| JP | 2006-239792 A | 9/2006 |
| JP | 2010-12564 A | 1/2010 |
| JP | 2010-284787 A | 12/2010 |

* cited by examiner

COATED CUTTING TOOL AND METHOD FOR PRODUCING THE SAME

CROSS REFERENCE TO RELATED APPLICATIONS

This application is a U.S. National Stage Application under 35 U.S.C. § 371 of International Application No. PCT/JP2015/058116, filed Mar. 18, 2015, which claims priority from Japanese Patent Application No. 2014-055563, filed Mar. 18, 2014. Each of the above applications is hereby expressly incorporated by reference, in its entirety, into the present application.

TECHNICAL FIELD

The present disclosure relates to a coated cutting tool having a hard coating coated on the surface of a base material, and a method for producing the same.

BACKGROUND ART

In recent years, for cut processing of metal mold materials that are used for press molding of a plate material, such as bending, drawing, or trimming, at room temperature, machining of pre-hardened steel having high hardness and machining with high efficiency have been demanded. For cutting tools, more excellent durability is required, and thus a coated cutting tool produced by coating, on the surface of a cutting tool, a hard coating which is made of various ceramics having excellent heat resistance or excellent abrasion resistance, has been applied. For example, a coated cutting tool coated with an AlCrSi series nitride or carbonitride has been proposed, the AlCrSi series nitride or carbonitride being obtained by adding Si to a nitride or a carbonitride, which consists mainly of Al and Cr and is a kind of film that has excellent heat resistance, to thereby enhance the abrasion resistance or heat resistance (see, for example, Japanese Patent Application Laid-Open (JP-A) No. 2006-239792, JP-A No. 2005-126736, and JP-A No. 2004-337988).

JP-A No. 2002-337007 indicates that an AlCrSi series nitride having a microstructure, which includes a relatively Si-rich amorphous phase and a relatively Si-poor crystal phase, exhibits an enhanced film hardness and also improved resistance to oxidation, and application of this material results in increased durability of a coated cutting tool.

Further, regarding the conditions for film formation at the time of coating a nitride or a carbonitride, which consists mainly of Al and Cr, research has been conducted on various conditions. For example, to applying a pulse bias voltage at the time of coating a nitride that consists mainly of Al and Cr has been demonstrated (see, for example, JP-A No. 2010-12564, and JP-A No. 2010-284787).

SUMMARY OF INVENTION

Technical Problem

Recently, enhancement of the hardness of workpieces and further increases in machining speed have been realized, and therefore, higher durability is required for the coated cutting tools. The present inventors have conducted intensive research and, as a result, have found that there remains room for further improvement in the durability of the coated cutting tools coated with an AlCrSi series nitride or carbonitride.

The present disclosure has been made in consideration of the above problems, and it is an object of the embodiment of the invention to provide a coated cutting tool having more excellent durability and a method for producing a coated cutting tool, the method being capable of stably producing a coated cutting tool having excellent durability.

Solution to Problem

Specific means for addressing the above problems include the following embodiments. Namely, the first embodiment of the invention is as follows.

<1> A coated cutting tool having a base material and a hard coating disposed on a surface of the base material, wherein:

the hard coating is made of a nitride or a carbonitride in which an aluminum (Al) content is from 50 at. % to 68 at. %, a chromium (Cr) content is from 20 at. % to 46 at. %, and a silicon (Si) content is from 4 at. % to 15 at. % with respect to a total amount of metal (including semimetal) elements, and when a total of metal (including semimetal) elements, nitrogen, oxygen, and carbon is designated as 100 at. %, an atomic percentage (at. %) A of metal (including semimetal) elements and an atomic percentage (at. %) B of nitrogen satisfy the relationship $1.03 \leq B/A \leq 1.07$; and, in an intensity profile obtained from an X-ray diffraction pattern or a selected area diffraction pattern of a transmission electron microscope, an intensity of a peak from a (200) plane or a (111) plane of a face-centered cubic lattice structure exhibits the maximum intensity.

<2> In <1> above, it is preferable that, in an intensity profile obtained from a selected area diffraction pattern of a transmission electron microscope, the hard coating satisfies the relationship $Ih \times 100/Is \leq 25$, wherein Ih represents an intensity of a peak from a (010) plane of AlN having a hexagonal close packing structure, and Is represents a total of intensities of peaks from a (111) plane of AlN, a (111) plane of CrN, a (200) plane of AlN, a (200) plane of CrN, a (220) plane of AlN, and a (220) plane of CrN, each having a face-centered cubic lattice structure, and intensities of peaks from a (010) plane of AlN, a (011) plane of AlN, and a (110) plane of AlN, each having a hexagonal close packing structure.

<3> In <1> or <2> above, it is preferable that, in the hard coating, a content of one or more elements selected from the group consisting of metal elements belonging to Group 4 (Group 4a), Group 5 (Group 5a), and Group 6 (Group 6a) (excluding Cr) of the Periodic Table and boron (B) is 15 at. % or lower with respect to a total amount of metal (including semimetal) elements.

<4> In any one of <1> to <3> above, it is preferable to further have a protective coating, which is formed from a nitride or a carbonitride and has a different composition from that of the hard coating, on the hard coating disposed on the base material.

It is preferable that the protective coating to be disposed on the hard coating is a film formed from a nitride or a carbonitride in which a Ti content (at. %) is 50% or higher and a Si content is from 1% to 30% with respect to a total amount of metal (including semimetal) elements.

<5> In any one of <1> to <4> above, it is preferable that the hard coating has a nanoindentation hardness of from 40 GPa to 55 GPa.

The second embodiment of the invention is as follows.

<6> A method for producing a coated cutting tool, the method including a process of forming a hard coating on a surface of a base material by: mounting, on a cathode, an alloy target in which an aluminum (Al) content (at. %) is from 55% to 70%, a chromium (Cr) content (at. %) is from 20% to 35%, and a silicon (Si) content (at. %) is from 7% to 20% with respect to a total amount of metal (including semimetal) elements; and coating a nitride or a carbonitride on the surface of the base material in accordance with an arc ion plating method under conditions including a bias voltage applied to the base material of from −220 V to −60 V and a cathode voltage of from 22 V to 27 V, or under conditions including a bias voltage applied to the base material of from −120 V to −60 V and a cathode voltage of from 28 V to 32 V.

Advantageous Effects of Invention

According to an embodiment of the invention, a coated cutting tool having excellent durability may be provided.

Further, according to another embodiment of the invention, a method for producing a coated cutting tool, the method being capable of stably producing a coated cutting tool having excellent durability.

DESCRIPTION OF EMBODIMENTS

Hereinafter, the coated cutting tool and production method thereof according to the embodiments of the invention are described in detail.

Note that, in this specification, the term "X-ray diffraction pattern" indicates the diffraction peak curve, which is measured by using an X-ray diffractometer (trade name: RINT2000; manufactured by Rigaku Corporation; a vertical goniometer and a fixed monochrometer are used).

Further, the term "selected area diffraction pattern" indicates the diffraction pattern by a transmission electron microscope, when taking out only the electron beam from a given region by using a selected area aperture.

[Coated Cutting Tool]

The coated cutting tool according to the embodiment of the invention has a base material and a hard coating disposed on the surface of the base material, and, if necessary, other film such as a protective coating that protects the hard coating, an intermediate coating that is disposed between the base material and the hard coating, or the like may be applied.

—Hard Coating Film—

The hard coating in this disclosure is made of a nitride or a carbonitride in which the aluminum (Al) content is from 50 at. % to 68 at. %, the chromium (Cr) content is from 20 at. % to 46 at. %, and the silicon (Si) content is from 4 at. % to 15 at. % with respect to the total amount of metal (including semimetal) elements, and when the total of metal (including semimetal) elements, nitrogen, oxygen, and carbon is designated as 100 at. %, the atomic percentage (at. %) A of metal (including semimetal) elements and the atomic percentage (at. %) B of nitrogen satisfy the relationship $1.03 \leq B/A \leq 1.07$, and further, in an intensity profile obtained from an X-ray diffraction pattern or a selected area diffraction pattern of a transmission electron microscope, the intensity of a peak from the (200) plane or the (111) plane of a face-centered cubic lattice structure exhibits the maximum intensity.

The present inventors have conducted investigation related to the cause of damage in coated cutting tools in cut processing of a high hardness material, and have focused on a large columnar grain boundary that exists in the hard coating. As a result, it is confirmed that film destruction is likely to occur, when a large columnar grain boundary, which is so large as to reach the base material from the coating surface, exists in the hard coating, in the thickness direction of a hard coating. Further, it is confirmed that it is effective to reduce the amount of large crystal grain boundaries, which may become a starting point of destruction, by using an AlCr series nitride or carbonitride, which is a kind of film having excellent heat resistance and abrasion resistance, as the main component and micronizing the film structure. Moreover, it is confirmed that, for micronizing the film structure, it is effective to contain a certain amount of silicon (Si) element.

Further, it was found that, in order to let the coated cutting tool exhibit excellent durability, the coated cutting tool coated with a hard coating being made of a nitride or a carbonitride, which contains a certain amount of Si element, has a micronized film structure, and includes Al and Cr as the main elements, it is important that the atomic percentage of nitrogen is controlled to be within a certain range, with respect to the total amount of metal (including semimetal) elements.

The embodiments according to the present invention have been achieved based on the phenomenon confirmed as described above and the knowledge thus obtained.

The hard coating in this disclosure is made of a nitride or a carbonitride, which contains aluminum (Al), chromium (Cr), and silicon (Si). A nitride or a carbonitride, which contains Al and Cr as the main elements, can form a kind of film that exhibits excellent abrasion resistance and heat resistance as a coated cutting tool. Above all, regarding the composition that forms the hard coating, a nitride is more preferable. Further, in order to ensure excellent heat resistance, it is effective that Al is contained with a highest content in terms of atomic percentage (at. %), with respect to the total amount of metal (including semimetal) elements.

(Al)

Al is an element that imparts heat resistance. When the content (at. %) of an element other than Al becomes the highest, with respect to the total amount of metal (including semimetal) elements, the heat resistance gets lower. From the viewpoint of imparting excellent heat resistance to the hard coating, the Al content (at. %) shall be 50% or higher, with respect to the total amount of metal (including semimetal) elements. More preferably, the Al content (at. %) is 55% or higher, with respect to the total amount of metal (including semimetal) elements.

In the hard coating in this disclosure, when the Al content (at. %) is too high, the amount of AlN having an ZnS type hexagonal close packing (hcp; hereinafter, may be abbreviated to simply "hcp") structure, which exists at a micro level, increases and the durability of the coated cutting tool is likely to get lower. Therefore, in the hard coating in this disclosure, the Al content shall be 68 at. % or lower. The Al content is preferably 65 at. % or lower, and more preferably 60 at. % or lower.

Note that, in this disclosure, the term "semimetal" refers to boron (B), silicon (Si), germanium (Ge), or arsenic (As).

(Cr)

The hard coating in this disclosure contains from 20 at. % to 46 at. % of Cr, with respect to the total amount of metal (including semimetal) elements. When the Cr content is within the above range, the abrasion resistance and heat resistance of the hard coating become more excellent. When the Cr content (at. %) in the hard coating is too low, the abrasion resistance lowers, and besides, the amount of AlN having an hcp structure, which exists at a micro level, increases, resulting in decrease in durability of the coated cutting tool. When the Cr content (at. %) is too high, the heat resistance of the hard coating tends to get lower.

From the viewpoint of further enhancing both the abrasion resistance and heat resistance of the hard coating, the Cr content (at. %) is preferably 30 at. % or higher, and more preferably 35 at. % or higher, with respect to the total amount of metal (including semimetal) elements. Further, the Cr content is preferably in a range of 40 at. % or lower.

In the hard coating in this disclosure, from the viewpoint of further enhancing the abrasion resistance and the heat resistance, it is preferable that the sum of the contents of Al and Cr is 85 at. % or higher, with respect to the total amount of metal (including semimetal) elements. The sum of the contents of Al and Cr is more preferably 88 at. % or higher, and still more preferably 90 at. % or higher.

(Si)

In the hard coating in this disclosure, silicon (Si) is an important element for micronizing the film structure. The hard coating in this disclosure has a silicon (Si) content in a range of from 4 at. % to 15 at. %, with respect to the total amount of metal (including semimetal) elements. When the Si content is low, a nitride or a carbonitride, which includes Al and Cr as the main elements, has an organizational configuration in which a coarse columnar grain is clearly observed, in the machined cross section of the hard coating. In the organizational configuration, in which a coarse columnar grain is clearly observed, damage of the tool tends to be significant in cut processing of a high hardness material. Meanwhile, a nitride or a carbonitride, which contains Si at a certain amount and includes Al and Cr as the main elements, has a micronized structure, and in a case in which the machined cross section of the hard coating is observed, a clear columnar grain is less likely to be observed. The hard coating having such an organizational configuration has a small number of coarse crystal grain boundaries which may become a starting point of destruction, and thus tool damage can be suppressed. However, when the Si content is high, the amounts of amorphous phase and AlN having an hcp structure, which exist at a micro level, increase, and thus the durability of the coated cutting tool is likely to get lower.

Accordingly, in the hard coating in this disclosure, it is important that the Si content is in a range of from 4 at. % to 15 at. %, with respect to the total amount of metal (including semimetal) elements.

When the Si content is lower than 4 at. %, the columnar grain gets coarse, and thus the durability tends to get lower. When the Si content exceeds 15 at. %, the film structure easily becomes amorphous, and therefore, it becomes hard to have a face-centered cubic lattice (fcc; hereinafter, may be abbreviated to simply "fcc") structure as the main body, and the durability tends to get lower.

Above all, in the hard coating in this disclosure, the Si content (at. %) is preferably 5 at. % or higher, and more preferably 6 at. % or higher. Further, it is preferable that the Si content (at. %) is 12 at. % or lower.

The fcc structure in this disclosure is a crystal structure that can be identified by X-ray diffraction. The expression "having an fcc structure" refers to that, for example, the intensity of the peak from the hcp structure of AlN is not detected, when measurement is performed by using a commercially available X-ray diffractometer (trade name: RINT2000, manufactured by Rigaku Corporation; a vertical goniometer and a fixed monochrometer are used).

The atomic percentage (at. %) of each element contained in the hard coating is determined as follows. Using an electron probe micro analyzer (model number: JXA-8500F, manufactured by JEOL Ltd.), measurement is conducted at 5 points by the attached wavelength dispersive electron probe micro analyzer (WDS-EPMA), under the conditions described below, while setting the analysis depth at approximately 1 μm from the measurement surface, and then the measured values are averaged. From the average value thus obtained, the atomic percentage of each element is determined.

<Measurement Conditions>

Acceleration voltage: 10 kV

Irradiation current: $5 \times 10^{-8}$ A

Uptake time: 10 seconds

Diameter of analysis region: 1 μm

Regarding the hard coating in this disclosure, in an intensity profile obtained from an X-ray diffraction pattern or a selected area diffraction pattern of a transmission electron microscope, the intensity of the peak from the (200) plane or the (111) plane of an fcc structure exhibits the maximum intensity. When the amount of AlN having an hcp structure contained in the hard coating increases, the hard coating becomes brittle, and the durability as a coated cutting tool becomes poor. Further, even if the crystal structure of the hard coating is an fcc structure, in a case in which a crystal plane other than the (200) plane or the (111) plane exhibits the maximum intensity in an intensity profile obtained from an X-ray diffraction pattern or a selected area diffraction pattern of a transmission electron microscope, there is a tendency that the durability is poor.

The crystal structure of the hard coating in this disclosure can be confirmed with the intensity profile obtained from an X-ray diffraction pattern or a selected area diffraction pattern using a transmission electron microscope.

In a case in which the area to be tested of the hard coating is small, identification of crystal structure by X-ray diffraction may be difficult. In such a case, identification of crystal structure can be conducted by a selected area diffraction pattern using a transmission electron microscope, or the like. There are cases in which the hard coating in this disclosure contains an amorphous phase or AlN having an hcp structure in a part of the microstructure. In the hard coating in this disclosure, it is preferable that a diffraction pattern ascribable to the AlN having an hcp structure is not detected in a selected area diffraction pattern using a transmission electron microscope.

In this disclosure, it is important to form a hard coating by using a nitride or a carbonitride, which contains a certain amount of Si to realize a micronized film structure and includes Al and Cr as the main elements, and in addition to this, it is important, in the hard coating, to control the ratio of the atomic percentage (at. %) of nitrogen relative to the atomic percentage (at. %) of metal elements to be within a certain range.

In general, in a nitride or a carbonitride, which contains a certain amount of Si to realize a micronized film structure and includes Al and Cr as the main elements, the amounts of amorphous phase and AlN having an hcp structure are likely to increase, and even if such a nitride or a carbonitride is applied to the coated cutting tool, excellent durability tends to be hard to obtain. Under such circumstances, it is confirmed that, in the hard coating made of a nitride or a carbonitride, which contains a certain amount of Si to realize a micronized film structure and includes Al and Cr as the main elements, by increasing the atomic percentage (at. %) of the nitrogen incorporated, the crystallinity and heat resistance of the hard coating are further enhanced and the durability of the coated cutting tool is enhanced.

When the atomic percentage (at. %) of nitrogen in the hard coating is too high, the compressive residual pressure of the hard coating becomes too high and, as a result, the hard coating easily causes self-destruction.

Based on the above knowledge, with regard to the nitride or the carbonitride, which contains a certain amount of Si to realize a micronized film structure and includes Al and Cr as the main elements, investigations have been made on the optimum nitrogen content that can impart excellent durability to the coated cutting tool, and as a result, it was found that in a case in which the atomic percentage (at. %) A of metal (including semimetal) elements and the atomic percentage (at. %) B of nitrogen in the hard coating satisfy the relationship $1.03 \leq B/A \leq 1.07$, the durability of the coated cutting tool becomes excellent.

In the hard coating in this disclosure, when the value of B/A is less than 1.03, the amounts of amorphous phase and AlN having an hcp structure, which exist at a micro level, are likely to increase, and thus the durability of the coated cutting tool is remarkably deteriorated, and peeling tends to occur easily. When the value of B/A is more than 1.07, the compressive residual stress of the hard coating increases too much, the hard coating is likely to cause self-destruction and is likely to be worn, and thus the durability tends to get lower.

A more preferable range of B/A is $1.04 \leq B/A \leq 1.07$, and a still more preferable range of B/A is $1.04 \leq B/A \leq 1.05$.

The value of B/A above can be determined by performing composition analysis with respect to the hard coating, according to the wavelength dispersive electron probe micro analyzer (WDS-EPMA), as described above, followed by measuring the atomic percentages A and B.

The hard coating in this disclosure inevitably contains oxygen and carbon. Therefore, for example, in the case of analyzing the film composition of a nitride, when B/A is determined without taking the oxygen and carbon, which are included inevitably, into consideration, the content of nitrogen relatively gets higher, and there are cases in which the value of B/A above in the hard coating cannot be evaluated accurately. Accordingly, in analyzing the hard coating, in the case of determining the value of B/A above in the hard coating, the total of metal elements (including semimetal), nitrogen, oxygen, and carbon is designated as 100 at. %, the atomic percentage (at. %) of metal elements is designated as A, and the atomic percentage (at. %) of nitrogen is designated as B, whereby the value of B/A is determined.

Further, in the case of containing oxygen and carbon as inevitable elements, regarding the respective atomic percentages in the hard coating, when the total of metal elements (including semimetal), nitrogen, oxygen, and carbon is designated as 100 at. %, the atomic percentage of oxygen is preferably in a range of from 0.2 at. % to 3.0 at. % (more preferably, 2.0 at. % or lower, and still more preferably 1.0 at. % or lower), and when the total of metal elements (including semimetal), nitrogen, oxygen, and carbon is designated as 100 at. %, the atomic percentage of carbon is preferably in a range of from 0.2 at. % to 5.0 at. % (more preferably, 3.0 at. % or lower, and still more preferably 1.0 at. % or lower).

Among the above, the hard coating is preferably a coating made of a nitride including aluminum (Al), chromium (Cr), silicon (Si), nitrogen (N), and inevitable elements, or a carbonitride including aluminum (Al), chromium (Cr), silicon (Si), nitrogen (N), carbon (C), and inevitable elements.

Even if a metal element other than Al, Cr, or Si is contained, the hard coating in this disclosure can favorably maintain the durability of the coated cutting tool, as far as the contents of Al, Cr, and Si and B/A are each within the specific range and the intensity of the peak from to the (200) plane or the (111) plane of a face-centered cubic lattice structure exhibits the maximum intensity, as described above. Accordingly, the hard coating in this disclosure may contain a metal element other than Al, Cr, or Si.

In a case in which the hard coating in this disclosure contains a metal element other than Al, Cr, or Si, it is preferable to contain one or two or more elements selected from the group consisting of Group 4 (Group 4a), Group 5 (Group 5a), and Group 6 (Group 6a) (excluding Cr) of the Periodic Table and boron (B). These elements are elements that impart abrasion resistance or heat resistance to the hard coating, and when one or more of these elements are contained within a predetermined range with respect to the total amount of metal (including semimetal) elements, the elements do not remarkably deteriorate the durability of the coated cutting tool. However, in a case in which the hard coating contains a metal element other than Al, Cr, or Si, when the content thereof in the hard coating is too high, the durability of the coated cutting tool may be deteriorated. Therefore, it is preferable that the hard coating in this disclosure contains one or two or more elements selected from the group consisting of Group 4, Group 5, and Group 6 (excluding Cr) of the Periodic Table and boron (B) within a range of 15 at. % or lower, with respect to the total amount of metal (including semimetal) elements. Above all, for the same reason, the content of the element selected from the group consisting of metal elements belonging in Group 4, Group 5, and Group 6 (excluding Cr) of the Periodic Table and boron (B) is more preferably 10 at. % or lower, and is still more preferably 0 at. % (namely, the element is not included).

Specifically, the hard coating in this disclosure is more preferably an AlCrSi nitride consisting of Al, Cr, Si, N, and inevitable elements or an AlCrSi carbonitride consisting of Al, Cr, Si, N, C, and inevitable elements, and particularly preferably an AlCrSi nitride consisting of Al, Cr, Si, N, and inevitable elements. The AlCrSi nitride and the AlCrSi carbonitride are advantageous in terms of production costs.

It is preferable that the hard coating in this disclosure has a nanoindentation hardness of from 40 GPa to 55 GPa. In a nitride or a carbonitride which contains Al, Cr, and Si each with a certain content, the amounts of AlN having an hcp structure and amorphous phase increase, and the hardness tends to get lower. In a case in which the hardness of the hard coating is low, even if the composition of the hard coating and the nitrogen content are controlled, the durability of the coated cutting tool is deteriorated. In order to impart a high level of durability to the coated cutting tool, it is preferable that the nanoindentation hardness of the hard coating is 40 GPa or more. Further, it is preferable that the nanoindentation hardness is 45 GPa or more. Meanwhile, in a hard coating made of a nitride or a carbonitride which includes Al and Cr as the main elements, when the hardness is too high, the adhesion tends to get lower. Accordingly, it is preferable that the nanoindentation hardness of the hard coating in this disclosure is 55 GPa or less.

The nanoindentation hardness of the hard coating can be adjusted to fall within the above range by controlling the film composition, and in addition, by controlling the negative bias voltage to be applied to the base material, the film forming temperature, and the average magnetic flux density of the cathode each to be within an appropriate range, whereby a high level of durability can be imparted to the coated cutting tool.

In the hard coating in this disclosure, it is preferable that the nanoindentaion hardness satisfies the range described above, and moreover, that the elastic coefficient of the hard coating is 390 GPa or more. When a higher film hardness is realized and moreover the elastic coefficient of the hard coating is adjusted to 390 GPa or more, more excellent durability can be imparted to the coated cutting tool. In order to impart more excellent toughness to the hard coating, it is preferable that the elastic coefficient of the hard coating is 450 GPa or less. Above all, from the same reason as described above, the elastic coefficient is more preferably in a range of from 400 GPa to 430 GPa.

The nanoindentation hardness and elastic coefficient of the hard coating in this disclosure are determined as follows. Namely, using a nanoindentation apparatus (a nanoindentation hardness tester ENT-1100a, manufactured by ELIONIX INC.), a terminal is pressed from the surface of the hard coating, under the measurement conditions of an indentation load of 49 mN, a maximum load retention time of 1 second, and a removing speed after loading of 0.49 mN/sec, and the maximum depth in which the indentation depth is kept at $\frac{1}{10}$ or less of the thickness of the hard coating is measured at 10 points. Then, two points from the greater value side and two points from the smaller value side are eliminated and the values of the residual six points are averaged. From the average value thus obtained, the nanoindentation hardness and the elastic coefficient are determined.

The microstructure of the hard coating in this disclosure is preferably an organizational configuration that has, in the crystal structure, a crystal phase having a relatively high Si content and a crystal phase having a relatively low Si content. When the microstructure of the hard coating has such an organizational configuration, a higher compressive residual pressure is imparted to the hard coating, and thus the film hardness is enhanced, and moreover, the progress of cracking is easily suppressed at a micro level.

The hard coating in this disclosure has a high Si content, and thus the AlN having an hcp structure may exist in the microstructure. For quantifying the amount of AlN having an hcp structure, which exists in the microstructure of the hard coating, an intensity profile can be used, which may be determined from the selected area diffraction pattern of a transmission electron microscope, when observing the machined cross section of the hard coating. Specifically, in the intensity profile of a selected area diffraction pattern of a transmission electron microscope, the relationship of Ih×100/Is is evaluated.

Ih=the intensity of the peak from the (010) plane of AlN having an hcp structure Is=the total of the intensities of peaks from the (111) plane of AlN, the (111) plane of CrN, the (200) plane of AlN, the (200) plane of CrN, the (220) plane of AlN, and the (220) plane of CrN, each having an fcc structure, and the intensities of peaks from the (010) plane of AlN, the (011) plane of AlN, and the (110) plane of AlN, each having an hcp structure By evaluating the relationship described above, the AlN having an hcp structure, which is incorporated at a micro level, can be quantitatively evaluated, in the hard coating in which the intensity of the peak from the AlN having an hcp structure is not detected by X-ray diffraction.

It is preferable that the hard coating in this disclosure satisfies the relationship Ih×100/Is≤25, by further reducing the amount of AlN having an hcp structure, which exists in the microstructure. When the relationship Ih×100/Is≤25 is satisfied, the durability of the coated cutting tool is more excellent.

Further, it is preferable that the hard coating in this disclosure satisfies the relationship Ih×100/Is≤20.

In order to impart more excellent durability to the coated cutting tool, the film thickness of the hard coating is preferably 1.0 μm or more, and more preferably 2.0 μm or more. When the film thickness is too thick, a risk of occurrence of film peeling tends to become higher. Therefore, the film thickness of the hard coating is preferably 5.0 μm or less, and more preferably 4.0 μm or less.

—Other Film—

Other film may be further provided on the hard coating that is disposed on the base material. Even if other film is contained, the effects in the embodiment of the invention are favorably exhibited. In the coated cutting tool of the embodiment of the invention, besides the form in which the AlCrSi series nitride or carbonitride forms the outermost surface, a form in which other film forms the outermost surface may be adopted. For example, as the upper layer of the hard coating in this disclosure, other film made of a metal, a nitride, a carbonitride, an oxynitride, a carbide, a boride, or an oxide may be provided. It is preferable to have a protective coating, which is made of a nitride or a carbonitride and exhibits excellent heat resistance and abrasion resistance, on the hard coating that is disposed on the base material. It is more preferable to have a protective coating made of a nitride.

The protective coating is preferably a hard coating having a compressive residual pressure that exhibits excellent resistance to thermal shock. In wet machining, the hard coating may come off easily due to the cycle of heating and cooling, and therefore, it is preferable to provide a hard coating having a high compressive residual pressure, as the protective coating. Specifically, a coating made of a nitride or a carbonitride, in which the atomic percentage of Ti is 50 at. % or higher (preferably 75 at. % or higher) and the atomic percentage of Si is from 1 at. % to 30 at. % (preferably from 15 at. % to 30 at. %) with respect to the total amount of metal (including semimetal) elements is preferable as the protective coating that is disposed on the hard coating, from the viewpoint of being a kind of film having excellent abrasion resistance and also having a high compressive residual pressure.

In the case of further disposing other film on the hard coating in this disclosure, it is preferable that, among the hard coating in this disclosure and the other film, the hard coating in this disclosure is the thickest film in terms of film thickness. When the hard coating in this disclosure is formed as the thickest film and is the main film, the coated cutting tool exhibits more excellent durability.

The coated cutting tool according to the embodiment of the invention may be provided with an intermediate coating, in which a metal, a nitride, a carbonitride, a carbide, or the like is used, between the base material and the hard coating. By having an intermediate coating, there are cases in which the adhesion between the base material and the hard coating is further improved.

—Base Material—

The coated cutting tool according to the embodiment of the invention is equipped with a base material.

The base material is not particularly limited and, for example, cemented carbide, cermets, ceramics, high-speed steel, or the like can be applied, if appropriate, according to the cutting conditions. The base material is preferably a WC-based cemented carbide. Particularly, when a WC-based cemented carbide having a hardness of from 93.0 HRA to 95.0 HRA is applied to the base material, excellent durability is easily exhibited in cut processing of high hardness steel, which is thus preferable. WC represents tungsten carbide.

When the coated cutting tool according to the embodiment of the invention is applied to a ball end mill, particularly excellent durability is exhibited. In a ball end mill, unlike a square end mill which performs machining of a workpiece with an outer circumference cutting edge of the tool, a chisel unit performs machining while contacting the workpiece consistently. Accordingly, with respect to the chisel unit of a ball end mill, more excellent heat resistance and abrasion resistance are demanded, and application of an AlCrSi series nitride or carbonitride is effective in view of exhibiting more excellent durability.

Particularly, when the coated cutting tool according to the embodiment of the invention is applied to a small-diameter ball end mill having a tool diameter of 4 mm or less, the durability improvement effect is further effectively exhibited, which is thus preferable.

[Method for Producing Coated Cutting Tool]

The coated cutting tool according to the embodiment of the invention may be produced by any method as far as the contents of Al, Cr, and Si and B/A are each within the specific range and the intensity of the peak from the (200) plane or the (111) plane of a face-centered cubic lattice structure exhibits the maximum intensity, as described above.

Above all, from the viewpoint of stably producing a coated cutting tool having excellent durability, the coated cutting tool according to the embodiment of the invention is preferably produced by a method (a method for producing the coated cutting tool according to an embodiment of the invention) having a process of forming a hard coating on the surface of a base material, by mounting, on a cathode, an alloy target in which the aluminum (Al) content (at. %) is from 55% to 70%, the chromium (Cr) content (at. %) is from 20% to 35%, and the silicon (Si) content (at. %) is from 7% to 20% with respect to the total amount of metal (including semimetal) elements, and then coating a nitride or a carbonitride on the surface of the base material in accordance with an arc ion plating method under the conditions of a bias voltage to be applied to the base material of from −220 V to −60 V and a cathode voltage of from 22 V to 27 V, or under the conditions of a bias voltage to be applied to the base material of from −120 V to −60 V and a cathode voltage of from 28 V to 32 V.

In the arc ion plating method, a target that contains a metal component necessary for film formation is mounted on the cathode (negative electrode), and then, vacuum arc discharge is generated between the cathode and the anode (positive electrode), the metal component is evaporated from the surface of the target and ionized, and the ionized metal component is accumulated on the surface of the base material to which a negative bias voltage is applied, thereby forming a coating. In this process, the electron that has been discharged from the cathode by the arc discharge moves toward the anode, and when the electron that has moved collides with the supplied reactive gas such as nitrogen gas or the like, the gas component is ionized and the ionized gas component reacts with the target component, thereby forming a hard coating on the surface of the base material.

Here, since electron energy (eV) is proportional to voltage, by heightening the cathode voltage, the electron energy gets higher, and ionization of the reactive gas is further accelerated.

In this disclosure, the present inventors have found that, in the case of forming a hard coating made of a nitride or a carbonitride, which contains a certain amount of Si and includes Al and Cr as the main elements, by adjusting the cathode voltage to fall within a certain range, the amount of AlN having an hcp structure, which exists in the microstructure of the hard coating, decreases and besides, the atomic percentage (at. %) of nitrogen contained in the hard coating, namely, the ratio of the atomic percentage (at. %) B of nitrogen relative to the atomic percentage (at. %) A of metal (including semimetal) elements gets higher, and thus there is a tendency of enhancing the durability of the coated cutting tool.

However, even if the cathode voltage is heightened, when the absolute value of the bias voltage to be applied to the base material is small, the atomic percentage of nitrogen contained in the hard coating does not become more than or equal to a certain value, and thus there is a tendency that also the amount of AlN having an hcp structure, which exists in the microstructure, is hardly reduced. Further, when the cathode voltage is too high, the burden on the apparatus is increased, and stable film formation becomes hard to achieve. Accordingly, it is also important to adjust the bias voltage to be applied to the base material to fall within a certain range.

In the film forming process of forming the hard coating in this disclosure, in order to stably produce a coated cutting tool having excellent durability, it is preferable to perform film formation while keeping a balance between the negative bias voltage to be applied to the base material and the cathode voltage. Specifically, film formation is performed by adjusting the condition to the condition (hereinafter, Condition 1) in which the bias voltage to be applied to the base material is from −220 V to −60 V and the cathode voltage is from 22 V to 27 V, or the condition (hereinafter, Condition 2) in which the bias voltage to be applied to the base material is from −120 V to −60 V and the cathode voltage is from 28 V to 32 V.

In Condition 1 above, when the cathode voltage is adjusted to 22 V or higher, the atomic percentage (at. %) of nitrogen in the hard coating gets higher, as well as the amount of AlN having an hcp structure, which exists in the microstructure, decreases, as a result of which a high abrasion resistance can be imparted to the hard coating. When the cathode voltage is 27 V or lower, the amount of AlN having an hcp structure, which exists in the microstructure, decreases, as well as the atomic percentage of nitrogen in the hard coating shows a tendency of increase, and the burden on the apparatus is reduced, as a result of which film formation can be performed stably. The cathode voltage in Condition 1 is preferably from 24 V to 26 V.

In a case in which the cathode voltage is within the above range, when the bias voltage to be applied to the base material is higher than −60 V (on the plus side from −60 V), even if the cathode voltage is set higher, it is hard to increase the ratio of the atomic percentage of nitrogen relative to the atomic percentage of metal elements, and thus the durability of the coated cutting tool shows a tendency of decrease, and film peeling is likely to occur. Further, the amount of AlN having an hcp structure, which exists in the microstructure of the hard coating, tends to increase. When the bias voltage to be applied to the base material is lower than −220 V (on the minus side from −220 V), the ratio of the atomic percentage of nitrogen relative to the atomic percentage of metal elements becomes too high, and the durability of the coated cutting tool shows a tendency of decrease. Further, the burden on the apparatus is increased, and there are cases in which film formation is not stably performed. Above all, the negative bias voltage to be applied to the base material is preferably in a range of from −190 V to −70 V, more preferably in a range of from −150 V to −80 V, and still more preferably in a range of from −150 V to −100 V.

Further, in Condition 2 above, similar to the case of Condition 1 above, when the cathode voltage is 28 V or higher, the atomic percentage (at. %) of nitrogen in the hard coating gets higher, as well as the amount of AlN having an hcp structure, which exists in the microstructure, decreases, as a result of which a high abrasion resistance can be imparted to the hard coating. When the cathode voltage is 32 V or lower, the amount of AlN having an hcp structure, which exists in the microstructure, decreases, as well as the atomic percentage of nitrogen in the hard coating shows a tendency of increase, and the burden on the apparatus is reduced, as a result of which film formation can be performed stably. The cathode voltage in Condition 2 is preferably from 30 V to 32 V.

In a case in which the cathode voltage is within a relatively high range as described above, the bias voltage to be applied to the base material is adjusted to fall within a range that is not too low. When the bias voltage to be applied to the base material is in a range lower than −120 V (a range on the minus side from −120 V), the ratio of the atomic percentage of nitrogen relative to the atomic percentage of metal elements shows a tendency of getting too high, and the durability of the coated cutting tool shows a tendency of decrease. Further, the burden on the apparatus is increased, and there are cases in which film formation is not stably performed. When the bias voltage is higher than −60 V (on the plus side from −60 V), even if the cathode voltage is set higher, it is hard to increase the ratio of the atomic percentage of nitrogen relative to the atomic percentage of metal elements, and thus the durability of the coated cutting tool shows a tendency of decrease, and film peeling is likely to occur. Further, the amount of AlN having an hcp structure, which exists in the microstructure of the hard coating, tends to increase. Above all, the negative bias voltage to be applied to the base material is preferably in a range of from −100 V to −70 V.

Coating operation in accordance with the arc ion plating method in this disclosure can be carried out using a generally-used arc ion plating apparatus.

The composition of the alloy target and the content of metal elements in the hard coating coated on the surface of a base material may differ depending on the condition for film formation. According to the investigation made by the present inventors, in the above-described ranges of cathode voltage and bias voltage, the contents of Al and Si in the hard coating decrease easier as compared with the composition of the alloy target, and the content of Cr in the hard coating tends to increase easier as compared with the composition of the alloy target.

Accordingly, in the case of coating a hard coating on the surface of a base material, it is preferable to perform film formation by mounting, on a cathode, an alloy target in which the Al content is from 55 at. % to 70 at. %, the Cr content is from 20 at. % to 35 at. %, and the Si content is from 7 at. % to 20 at. %, with respect to the total amount of metal (including semimetal) elements. When an alloy target having the above composition range is used as the cathode, the hard coating after coating can be easily controlled to have a composition within the aimed range.

In this disclosure, it is preferable to introduce nitrogen gas into the furnace at the time of film formation and perform coating of a hard coating while adjusting the gas pressure inside the furnace to fall within the range of from 3 Pa to 10 Pa (preferably under the above Condition 1 or Condition 2). In a case in which the gas pressure inside the furnace at the time of film formation is high, the ratio of the atomic percentage of nitrogen relative to the atomic percentage of metal elements in the hard coating to be formed is likely to increase. However, when a hard coating is coated in a state in which an excess amount of nitrogen gas is introduced into the furnace, furnace pollution may occur and there are cases in which stable film formation is hard to achieve. Accordingly, it is preferable that the gas pressure inside the furnace is from 3 Pa to 7 Pa.

In the hard coating of a coated cutting tool, when the amounts of amorphous phase and AlN having an hcp structure, which exist in the microstructure, are increased, the hardness and toughness of the coating are deteriorated, and the durability of the coated cutting tool tends to decrease. In the case of coating a hard coating, it is preferable to perform coating by using a cathode in which the average magnetic flux density of the vertical direction component in the vicinity of the center of the alloy target is 14 mT (militesla) or more. Further, it is preferable to use a cathode in which the magnetic arrangement is adjusted such that the line of magnetic force reaches the vicinity of the base material from the vicinity of the center of the alloy target.

When a hard coating is coated by using such a cathode, the crystallinity of the coating gets higher, the hardness and toughness of the coating are enhanced, as well as the amounts of amorphous phase and AlN having an hcp structure, which exist in the microstructure, are further reduced, and thus, the durability of the coated cutting tool can be further enhanced.

EXAMPLES

Hereinafter, an embodiment of the present invention is specifically described with reference to Examples; however, the embodiment of the invention is by no means limited to the following Examples unless they are beyond the spirit of the invention. Unless otherwise specifically stated, "part" is based on mass.

Example 1

Film Forming Apparatus

For film formation, a film forming apparatus utilizing the arc ion plating method was used. This film forming apparatus is equipped with plural cathodes (arc evaporation sources), a vacuum chamber, and a base material rotation mechanism. As the cathodes, one cathode (hereinafter referred to as "C1") equipped with a coil magnet at the outer circumference of the target and another cathode (hereinafter referred to as "C2"), which is equipped with permanent magnets at the back and outer circumference of the target, has a magnetic flux density in the direction perpendicular to the target surface, and has a magnetic flux density in the vertical direction in the vicinity of the target center of 14 mT, are mounted.

A metallic Ti target (a Ti target) was placed on C1. Further, an AlCrSi alloy target (hereinafter, an AlCrSi target) was placed on C2.

The vacuum chamber is configured such that the inside thereof can be evacuated using a vacuum pump, and a gas can be introduced through a supply port. To each base material that is placed inside the vacuum chamber, a bias power source is connected, and thus a negative DC bias voltage can be applied individually to each base material.

The base material rotation mechanism is equipped with a planetary, a plate-like jig that is placed on the planetary, and a pipe-like jig that is placed on the plate-like jig. The base material rotation mechanism is configured such that the planetary rotates at a speed of 3 rotation per minute and each of the plate-like jig and the pipe-like jig rotates and revolves.

<Base Material>

Two kinds of base materials shown below were prepared.

(1) As a base material for evaluation of physical properties and a base material for a cutting test, the following two-flute ball end mill made of cemented carbide (manufactured by Hitachi Tool Engineering, Ltd.) was prepared.

<Characteristics of Two-Flute Ball End Mill>

Composition: WC (bal.)—Co (8% by mass)—Cr (0.5% by mass)—VC (0.3% by mass)

Average grain size of WC: 0.6 μm

Hardness: 93.9 HRA

Ball radius: 0.5 mm (2) Further, as a base material for X-ray diffraction, the following test piece was prepared.

<Characteristics of Test Piece>

Composition: WC (bal.)—Co (13.5% by mass)—Cr (0.5% by mass)—TaC (0.3% by mass)

Size: 8 mm in width×25 mm in length, and 0.7 mm in thickness

<Heating and Evacuation>

Each base material was fixed to each pipe-like jig in the vacuum chamber, and the following operations were carried out before film formation. First, the inside of the vacuum chamber was evacuated to $8\times10^{-3}$ Pa or less. Thereafter, using a heater that was placed in the vacuum chamber, the base material was heated to a temperature of 500° C., and evacuation was conducted. The temperature of the base material was set at 500° C. and the pressure inside the vacuum chamber was set at $8\times10^{-3}$ Pa or less.

<Ar Bombardment Process>

Thereafter, argon (Ar) gas was introduced into the vacuum chamber, and the pressure inside the vacuum chamber was set at 0.67 Pa. Subsequently, an electric current of 20 A was supplied to the filament electrode, and a bias voltage of −200 V was applied to the base material. In this way, Ar bombardment treatment was carried out for 4 minutes.

<Ti Bombardment Process>

Thereafter, evacuation was conducted such that the pressure inside the vacuum chamber was $8\times10^{-3}$ Pa or less. Subsequently, a bias voltage of −800 V was applied to the base material, and an arc current of 150 A was supplied to C1. In this way, Ti bombardment treatment was carried out for 3 minutes.

<Film Forming Process>

Immediately after the Ti bombardment treatment, the supply of electric current to C1 was interrupted. Then, nitrogen gas was introduced into the vacuum chamber, and for each AlCrSi target to be used, the gas pressure inside the vacuum chamber and the negative bias voltage to be applied to the base material were changed as shown in Table 1 below. By supplying an electric current of 150 A to C2, a nitride or a carbonitride was coated on the surface of the base material in accordance with the arc ion plating method. In this way, a hard coating having a thickness of about 1.5 μm was formed on the base material. Here, the temperature of the base material at the time of film formation was set at 520° C., and the cathode voltage was changed as shown in Table 1 below.

Thereafter, the base material was cooled to approximately 250° C. or lower, and was taken out from the vacuum chamber, thereby obtaining a coated sample. The conditions for film formation of the hard coating in Coated Samples 1 to 13 thus obtained are shown in Table 1.

Note that, for the AlCrSi targets in Table 1, those having an element composition, in which the total atomic percentage (at. %) of Al, Cr, and Si is 99.9% or higher, were used.

TABLE 1

| | Coated Sample | Composition of AlCrSi Target (at. %) | Cathode Voltage (V) | Bias Voltage (V) | Gas Pressure (Pa) |
|---|---|---|---|---|---|
| Example 1 | 1 | Al60Cr30Si10 | 25 | −100 | 7 |
| Example 2 | 2 | Al60Cr30Si10 | 25 | −150 | 7 |
| Example 3 | 3 | Al60Cr30Si10 | 25 | −200 | 7 |
| Example 4 | 4 | Al60Cr30Si10 | 32 | −75 | 10 |
| Example 5 | 5 | Al60Cr30Si10 | 32 | −100 | 10 |
| Comparative Example 1 | 6 | Al60Cr30Si10 | 21 | −50 | 5 |
| Comparative Example 2 | 7 | Al60Cr30Si10 | 21 | −100 | 5 |
| Comparative Example 3 | 8 | Al60Cr30Si10 | 21 | −150 | 5 |
| Comparative Example 4 | 9 | Al60Cr30Si10 | 21 | −200 | 5 |
| Comparative Example 5 | 10 | Al60Cr30Si10 | 25 | −50 | 7 |
| Comparative Example 6 | 11 | Al60Cr30Si10 | 32 | −150 | 10 |
| Comparative Example 7 | 12 | Al60Cr30Si10 | 32 | −200 | 10 |
| Comparative Example 8 | 13 | Al62Cr35Si3 | 21 | −150 | 5 |

<Evaluation of Coated Sample>

(1) Composition of Coated Film

Using an electron probe micro analyzer (model number: JXA-8500F, manufactured by JEOL Ltd.), the element composition of the hard coating of each coated sample was measured at 5 points by the attached wavelength dispersive electron probe micro analyzer (WDS-EPMA), under the conditions described below, while setting the analysis depth at approximately 1 μm in the machined cross-section which was obtained by machining the ball end mill that was the base material for evaluation of physical properties. The element composition of the hard coating was determined from the average value of the measured values.

<Measurement Conditions>

Acceleration voltage: 10 kV

Irradiation current: $5\times10^{-8}$ A

Uptake time: 10 seconds

Diameter of analysis region: 1 μm (2) B/A

The value of the ratio (B/A) of the atomic percentage B of nitrogen relative to the atomic percentage A of metal (including semimetal) elements was determined, while designating the total of metal elements (including semimetal), nitrogen, oxygen, and carbon as 100%. Note that, in all of the coated samples, the content of oxygen and carbon accounts for about 1% of the total 100% described above.

The compositions of the hard coatings and the B/A values are shown in Table 2.

(3) Crystal Structure of Coated Sample

Using X-ray diffraction, the crystal structure of the hard coating in each coated sample was evaluated. Specifically, this evaluation was carried out using an X-ray diffractometer (trade name: RINT2000, manufactured by Rigaku Corporation; a vertical goniometer and a fixed monochrometer are used) under the measurement conditions of a tube voltage of 40 kV, a tube current of 300 mA, an X-ray source of CuKα (λ=0.15418 nm), and 2θ of from 20° to 70°.

As a result, it was confirmed that, in the hard coating, the intensity of the peak from the (200) plane or (111) plane of an fcc structure exhibited the maximum intensity. These results are shown in Table 2. Further, in all of the coated samples, the intensity of the peak from the AlN having an hcp structure was not detected in X-ray diffraction.

(4) Nanoindentation Hardness

Using a nanoindentation apparatus (model number: a nanoindentation hardness tester ENT-1100a, manufactured by ELIONIX INC.), the hardness and elastic coefficient of the hard coating of each of the coated samples were measured under the following conditions.

Specifically, the ball end mill that was the base material for evaluation of physical properties was inclined by 5°, and after mirror polishing, the maximum depth, in which the indentation depth within the polished surface of the hard coating is kept at $1/10$ or less of the thickness of the hard coating, was designated as the nanoindentation hardness.

The indentation depth was measured according to the following method. Namely, a terminal was pressed from the surface of the hard coating under the measurement conditions of an indentation load of 49 mN, a maximum load retention time of 1 second, and a removing speed after loading of 0.49 mN/sec, and the maximum depth, in which the indentation depth is kept at $1/10$ or less of the thickness of the hard coating, was measured. With respect to each coated sample, this measurement was carried out at 10 points. For each coated sample, two points from the greater value side and two points from the smaller value side were eliminated and the average value of the indentation depths of the residual six points was determined.

In all of the coated samples, the nanoindentation hardness was from 40 GPa to 50 GPa.

(5) Cross Sectional Structure of Coated Sample

Among the coated samples, the ball end mill that was the base material for evaluation of physical properties was machined, then the machined cross-section was observed through a transmission electron microscope, and the hard coating was analyzed. It was confirmed from the selected area diffraction pattern that, regarding the hard coatings in Coated Samples 1 to 5 of the invention, the intensity of the peak from the (200) plane or the (111) plane of an fcc structure exhibited the maximum intensity.

Further, the hard coatings in Coated Samples 1 to 5 of the invention were observed through a transmission electron microscope (TEM) at a magnification of 500,000. In this process, the TEM photomicrograph was observed and it was confirmed that the hard coating had an organizational configuration, in which a crystal phase having a relatively low Si content and a crystal phase having a relatively high Si content are included in the crystal structure.

Furthermore, among the coated samples, the ball end mill that was the base material for evaluation of physical properties was machined and the machined cross section of the hard coating was observed through a scanning electron microscope (SEM). As a representative example, an SEM photomicrograph (at a magnification of 40,000) representing the machined cross-section of Example 1 is shown in FIG. 1.

Figure 1:
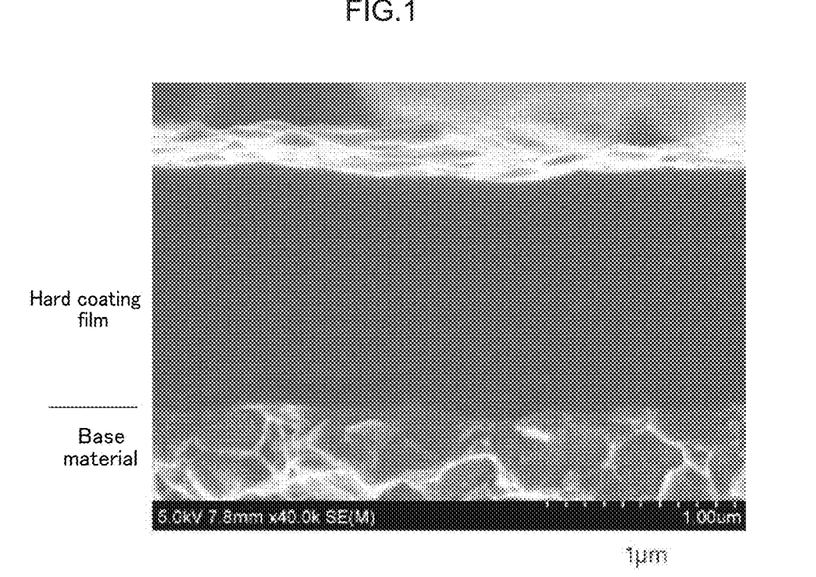
FIG. 1 is a scanning electron photomicrograph showing a cross sectional view of the hard coating in Coated Sample 1 of the invention.

As shown in FIG. 1, it is confirmed that the hard coating, which had an optimized Si content, in Coated Sample 1 of the invention had an organizational configuration in which a clear columnar grain is not detected. Further, the hard coating in Coated Samples 2 to 5 of the invention also had an organizational configuration in which a clear columnar grain is not detected.

Meanwhile, the hard coating, which had a low Si content, in Coated Sample 13 of Comparative Example 8 had an organizational configuration in which a coarse and clear columnar grain is detected. Further, the hard coatings, which contained a certain amount of Si, in Coated Samples 6 to 12 of Comparative Examples 1 to 7, had an organizational configuration in which a clear columnar grain is not detected.

(6) Cutting Test

A cutting test was conducted using the respective coated samples (coated cutting tools) thus prepared. The analysis results and the cutting test results are shown in Table 2. Note that, the cutting conditions are as follows.

<Cutting Conditions>

Machining method: wet machining
Tool: cemented carbide two-flute ball end mill
Model number: EPDBE2010-6, ball radius 0.5 mm, length under head 6 mm
Cutting method: bottom face cutting
Workpiece: HPM38 (52HRC) (manufactured by Hitachi Metals, Ltd.)
Depth of cutting: 0.04 mm in the axial direction and 0.04 mm in the radial direction
Cutting speed: 78.5 m/min
Feed amount per one edge: 0.0189 mm/edge
Cutting oil: water-soluble emulsion, supply under pressure
Cutting distance: 60 m
Evaluation method: after cut processing, the coated sample was observed using a scanning electron microscope at a magnification of 150, and the width of abrasion caused by the coated sample and the workpiece was measured. Among the measured values, the portion having the largest abrasion width was determined as the maximum abrasion width. A smaller value of maximum abrasion width indicates more excellent durability.

TABLE 2

|  | Coated Sample | Hard Coating Film (at. %) | B/A | Crystal Plane that Exhibits Maximum Intensity | Cutting Test Maximum Abrasion Width (μm) |
|---|---|---|---|---|---|
| Example 1 | 1 | (Al53Cr41Si6)N | 1.04 | (111) | 3 |
| Example 2 | 2 | (Al55Cr38Si7)N | 1.05 | (200) | 8 |
| Example 3 | 3 | (Al53Cr42Si5)N | 1.03 | (200) | 10 |
| Example 4 | 4 | (Al54Cr39Si7)N | 1.03 | (200) | 7 |
| Example 5 | 5 | (Al54Cr39Si7)N | 1.04 | (200) | 5 |
| Comparative Example 1 | 6 | (Al55Cr38Si7)N | 1.01 | (111) | 20 |

TABLE 2-continued

| Coated Sample | | Hard Coating Film (at. %) | B/A | Crystal Plane that Exhibits Maximum Intensity | Cutting Test Maximum Abrasion Width (μm) |
|---|---|---|---|---|---|
| Comparative Example 2 | 7 | (Al53Cr40Si7)N | 1.01 | (111) | 15 |
| Comparative Example 3 | 8 | (Al53Cr40Si7)N | 0.99 | (111) | 15 |
| Comparative Example 4 | 9 | (Al55Cr38Si7)N | 1.00 | (200) | 15 |
| Comparative Example 5 | 10 | (Al53Cr40Si7)N | 1.02 | (111) | 20 |
| Comparative Example 6 | 11 | (Al53Cr41Si6)N | 1.09 | (200) | 21 |
| Comparative Example 7 | 12 | (Al53Cr42Si5)N | 1.13 | (200) | 19 |
| Comparative Example 8 | 13 | (Al53Cr45Si2)N | 1.01 | (200) | 12 |

Each of the hard coatings thus formed had an element composition including Al, Cr, Si, and N each in an amount shown in Table 2 in terms of atomic percentage and, about 1 at. % of oxygen and about 1 at. % of carbon, as inevitable elements.

Coated Samples 1 to 5 of the invention showed a stable damage form with respect to abrasion, and had a tendency of suppressing the maximum abrasion width.

In Coated Samples 6 to 10 of Comparative Examples 1 to 5, the ratio (B/A) of nitrogen to the metal elements was lower than 1.03, and the maximum abrasion width was greater as compared with the coated samples of the invention. Further, in Coated Samples 11 and 12 of Comparative Examples 6 and 7, the ratio (B/A) of nitrogen to the metal elements was higher than 1.07, the residual stress of the hard coating became too high, the coating was likely to cause self-destruction, and the maximum abrasion width was greater as compared with the coated samples of the invention. In Coated Sample 13 of Comparative Example 8, since the amount of Si contained in the hard coating was low, the columnar grain in the hard coating got coarse, and the maximum abrasion width was greater as compared with the coated samples of the invention.

Example 2

Coated samples were prepared and evaluated in a manner similar to that in Example 1, except that the cathode voltage and the bias voltage to be applied to the base material in the film forming process in Example 1 were changed and a hard coating was coated. As the base material, the same base material as that in Example 1 was used, and the respective processes up to the Ar bombardment process in Example 1 were performed as same as those in Example 1.

Specifically, after the Ar bombardment process, nitrogen gas was introduced into the vacuum chamber, and the gas pressure inside the furnace was set at 5 Pa. Subsequently, the bias voltage to be applied to the base material and the cathode voltage of C2 provided with the AlCrSi target were changed as shown in Table 3 below, and a nitride or a carbonitride was coated on the surface of the base material in accordance with the arc ion plating method. In this way, a hard coating having a thickness of about 2.0 μm was formed on the base material. Here, the temperature of the base material at the time of film formation was set at 520° C.

Thereafter, the base material was cooled to approximately 250° C. or lower, and was taken out from the vacuum chamber, thereby obtaining a coated sample. The conditions for film formation of the hard coating in Coated Samples 20 to 35 thus obtained are shown in Table 3.

Note that, for the AlCrSi targets in Table 3, those having an element composition, in which the total percentage of Al, Cr, and Si, and further Nb in Example 26 is equal to or higher than 99.9 at. % of the total amount of metal (including semimetal) elements, were used.

TABLE 3

| | Coated Sample | Composition of AlCrSi Target (at. %) | Cathode Voltage (V) | Bias Voltage (V) |
|---|---|---|---|---|
| Example 20 | 20 | Al60Cr30Si10 | 32 | −75 |
| Example 21 | 21 | Al60Cr30Si10 | 32 | −100 |
| Example 22 | 22 | Al60Cr30Si10 | 25 | −100 |
| Example 23 | 23 | Al60Cr30Si10 | 25 | −150 |
| Example 24 | 24 | Al60Cr30Si10 | 25 | −200 |
| Example 25 | 25 | Al60Cr25Si15 | 25 | −100 |
| Example 26 | 26 | Al60Cr20Nb10Si10 | 25 | −100 |
| Comparative Example 20 | 27 | Al60Cr30Si10 | 32 | −150 |
| Comparative Example 21 | 28 | Al60Cr30Si10 | 32 | −200 |
| Comparative Example 22 | 29 | Al60Cr30Si10 | 32 | −50 |
| Comparative Example 23 | 30 | Al60Cr30Si10 | 25 | −50 |
| Comparative Example 24 | 31 | Al60Cr30Si10 | 21 | −50 |
| Comparative Example 25 | 32 | Al60Cr30Si10 | 21 | −100 |
| Comparative Example 26 | 33 | Al60Cr30Si10 | 21 | −150 |
| Comparative Example 27 | 34 | Al60Cr30Si10 | 21 | −200 |
| Comparative Example 28 | 35 | Al62Cr35Si3 | 32 | −100 |

With regard to the coated samples, evaluation was performed in a manner similar to that in Example 1. The elastic coefficient of the hard coating of each coated sample was determined as follows. Namely, similar to Example 1, a nanoindentation apparatus (model number: a nanoindentation hardness tester ENT-1100a, manufactured by ELIONIX INC.) was used, and the ball end mill that was the base material for evaluation of physical properties was inclined by 5°, and after mirror polishing, the elastic coefficient was determined as the maximum elastic coefficient in which the indentation depth within the polished surface of the hard coating is kept at 1/10 or less of the thickness of the hard coating. The method of measuring the indentation depth is as described above.

Further, with regard to the coated samples (coated cutting tools) thus prepared, a cutting test was conducted under the cutting conditions shown below. The evaluation results and the cutting test results are shown in Table 4. Details on the cutting conditions are as follows.

<Cutting Conditions>
Machining method: wet machining
Tool: cemented carbide two-flute ball end mill
Model number: EPDBE2010-6, ball radius 0.5 mm, length under head 6 mm
Cutting method: bottom face cutting
Workpiece: STAVAX (52HRC) (manufactured by UDDEHOLM KK)
Depth of cutting: 0.04 mm in the axial direction and 0.04 mm in the radial direction Cutting speed: 78.5 m/min
Feed amount per one edge: 0.0189 mm/edge
Cutting oil: water-soluble emulsion, supply under pressure
Cutting distance: 60 m
Evaluation method: after cut processing, the coated sample was observed using a scanning electron microscope at a magnification of 150, and the width of abrasion caused by the coated sample and the workpiece was measured. Among the measured values, the portion having the largest abrasion width was determined as the maximum abrasion width. A smaller value of maximum abrasion width indicates more excellent durability.

intensity of the peak from the (200) plane or (111) plane of a face-centered cubic lattice structure exhibits the maximum intensity, even if the composition includes a metal element other than Al, Cr, or Si, as in Coated Sample 26, an excellent durability is exhibited.

In the film forming process in Comparative Examples 20 and 21, the cathode voltage was heightened to 32 V, and moreover the negative bias voltage to be applied to the base material was from −200 V to −150 V, and therefore, an excess amount of nitrogen was incorporated in the hard coating, and the ratio (B/A) of nitrogen to the metal elements was higher than 1.07. Accordingly, in the cross sectional observation (at a magnification of 40,000) through a scan-

TABLE 4

|  | Coated Sample | Hard Coating Film (at. %) | B/A | Crystal Plane that Exhibits Maximum Intensity | Nano-indentation Hardness (GPa) | Elastic Coefficient (GPa) | Presence of Peeling, or Abrasion Width (μm) |
|---|---|---|---|---|---|---|---|
| Example 20 | 20 | (Al54Cr41Si5)N | 1.03 | (200) | 46 | 415 | 7 |
| Example 21 | 21 | (Al53Cr41Si6)N | 1.04 | (200) | 46 | 409 | 5 |
| Example 22 | 22 | (Al53Cr40Si7)N | 1.04 | (111) | 45 | 420 | 3 |
| Example 23 | 23 | (Al55Cr39Si6)N | 1.05 | (200) | 46 | 394 | 8 |
| Example 24 | 24 | (Al53Cr42Si5)N | 1.03 | (200) | 47 | 434 | 10 |
| Example 25 | 25 | (Al53Cr36Si11)N | 1.04 | (200) | 46 | 418 | 3 |
| Example 26 | 26 | (Al53Cr31Nb12Si4)N | 1.04 | (200) | 46 | 413 | 3 |
| Comparative Example 20 | 27 | (Al53Cr43Si4)N | 1.09 | (200) | 47 | 421 | 21 |
| Comparative Example 21 | 28 | (Al50Cr45Si5)N | 1.13 | (200) | 43 | 413 | 19 |
| Comparative Example 22 | 29 | (Al54Cr40Si6)N | 1.01 | (200) | 45 | 422 | Film peeling |
| Comparative Example 23 | 30 | (Al53Cr40Si7)N | 1.02 | (111) | 44 | 423 | Film peeling |
| Comparative Example 24 | 31 | (Al55Cr38Si7)N | 1.01 | (111) | 41 | 413 | Film peeling |
| Comparative Example 25 | 32 | (Al53Cr40Si7)N | 1.01 | (111) | 42 | 388 | Film peeling |
| Comparative Example 26 | 33 | (Al54Cr40Si6)N | 0.99 | (111) | 43 | 405 | Film peeling |
| Comparative Example 27 | 34 | (Al55Cr38Si7)N | 1.00 | (200) | 45 | 387 | Film peeling |
| Comparative Example 28 | 35 | (Al50Cr49Si1)N | 1.03 | (200) | 44 | 453 | 30 |

Each of the hard coatings thus formed had an element composition including Al, Cr, Si, and N (and further Nb in Coated Sample 26) each in an amount shown in Table 4 in terms of atomic percentage and, about 1 at. % of oxygen and about 1 at. % of carbon, as inevitable elements.

Coated Samples 20 to 26 of the invention showed a stable damage form with respect to abrasion, and had a tendency of suppressing the maximum abrasion width. It was confirmed, from the cross sectional observation (at a magnification of 40,000) through a scanning electron microscope, that the hard coatings in the coated samples of the invention had an organizational configuration in which a clear columnar grain is not detected. It is guessed as follows. Namely, since the hard coating in the coated sample of the invention has a small number of large crystal grain boundaries which may become a starting point of film destruction, a sudden film peeling does not occur and a stable damage form with respect to abrasion is exhibited.

Coated Sample 26 of the invention is an example that contains Nb (which is an element belonging in Group 5a of the Periodic Table) as the metal element other than Al, Cr, or Si. It is confirmed that, as far as the contents of Al, Cr, and Si and B/A are each within the specific range and the ning electron microscope, although Coated Samples 27 and 28 of Comparative Examples 20 and 21 had an organizational configuration similar to that of the coated samples of the invention, the residual stress of the hard coating became too high and the coating was likely to cause self-destruction, and there was a tendency that the maximum abrasion width became greater as compared with the examples of the invention.

Coated Samples 29 to 34 of Comparative Examples 22 to 27 had an organizational configuration similar to that of the coated samples of the invention, in the cross sectional observation (at a magnification of 40,000) through a scanning electron microscope, but the ratio (B/A) of nitrogen to the metal elements was lower than 1.03, the coated samples did not show a stable damage form with respect to abrasion like the coated samples of the invention, and significant film peeling occurred.

Further, in Coated Sample 35 of Comparative Example 28, although the ratio (B/A) of nitrogen to the metal elements was within the same range as that of the coated samples of the invention, since the Si content was low, the columnar grain became coarse, and the maximum abrasion width became greater as compared with the coated samples of the invention.

Figure 2:
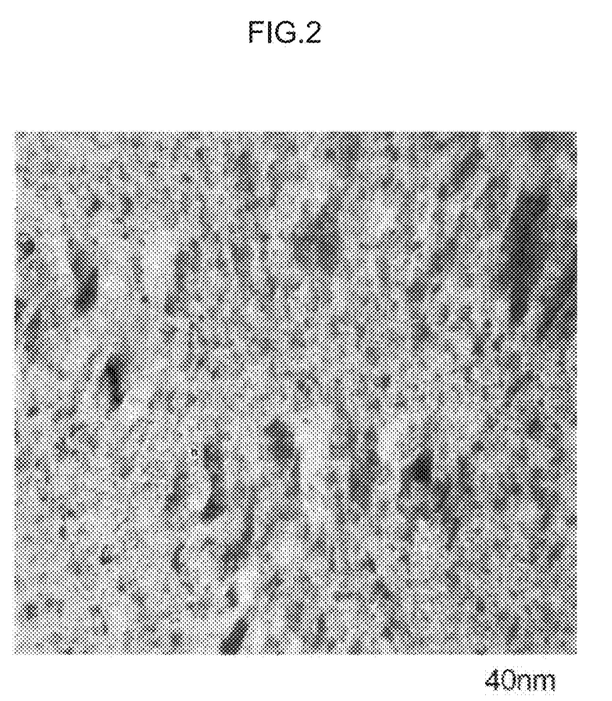
FIG. 2 is a transmission electron photomicrograph showing a cross sectional view of the hard coating in Coated Sample 23 of the invention.
Figure 3:
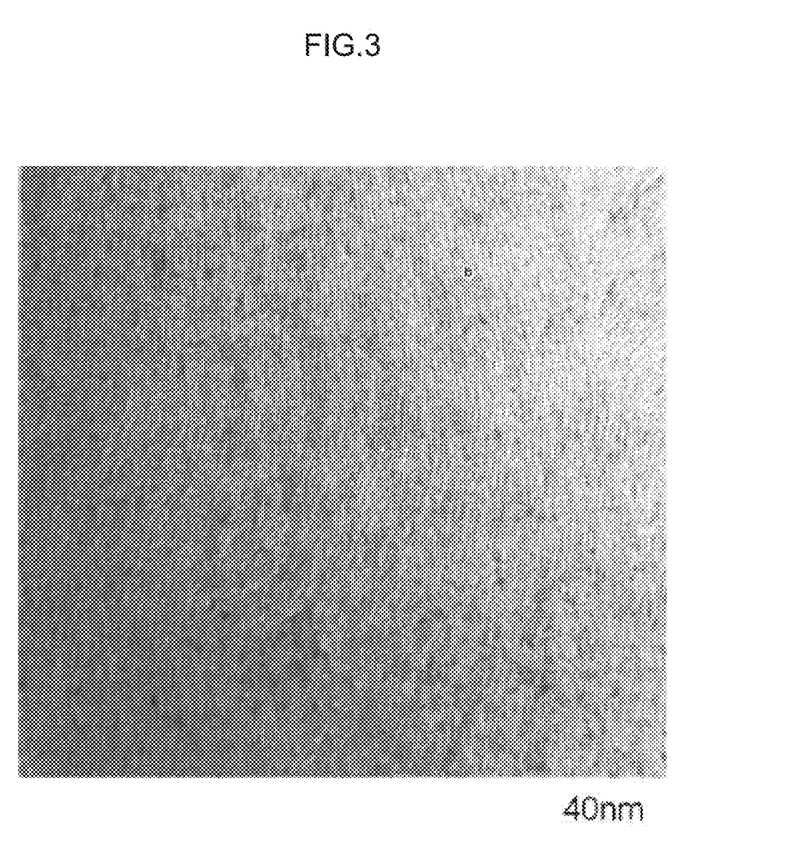
FIG. 3 is a transmission electron photomicrograph showing a cross sectional view of the hard coating in Coated Sample 33 of Comparative Example 26.

Concerning the difference in durability between the coated sample of the invention and the coated sample of the comparative example, Coated Sample 23 of the invention and Coated Sample 33 of Comparative Example 26 were observed through a transmission electron microscope and were subjected to photo analysis. FIG. 2 is an example of a transmission electron photomicrograph (at a magnification of 500,000) showing the cross sectional view of the hard coating in Coated Sample 23 of the invention. FIG. 3 is an example of a transmission electron photomicrograph (at a magnification of 500,000) showing the cross sectional view of the hard coating in Coated Sample 33 of Comparative Example 26.

In FIG. 2, the portion that looks relatively dark is a part containing a relatively large amount of Si, in the crystal structure. The portion that looks relatively white is a part containing a relatively small amount of Si, in the crystal structure. In the example shown in FIG. 2, the microstructure of the hard coating in the coated sample of the invention shows an organizational configuration in which the crystal phase containing a relatively large amount of Si is dispersed in the crystal phase containing a relatively small amount of Si, in the crystal structure.

Thus, it is confirmed that the microstructure of the hard coating in Coated Sample 23 of the invention had a crystal phase containing a relatively small amount of Si and a crystal phase containing a relatively large amount of Si, in the crystal structure. In the microstructure of the hard coating in the coated sample of the invention, the crystal phases, which look relatively dark (the crystal phases containing a relatively large amount of Si) and have an equivalent circular diameter of from 20 nm to 100 nm, are in the state of being dispersed.

Meanwhile, in the hard coating in Coated Sample 33 of Comparative Example 26, the crystal phase that looked relatively dark (the crystal phase containing a relatively large amount of Si) was minute as compared with the coated sample of the invention.

The hard coatings in Coated Sample 23 of the invention and Coated Sample 33 of Comparative Example 26 had almost the same film composition but showed an organizational configuration different in microstructure.

Regarding the hard coatings in the coated samples of the invention and the coated samples of the comparative examples, the AlN having an hcp structure was evaluated.

Specifically, the hard coating was machined and, in the machined cross section of the hard coating, the selected area diffraction pattern of the base material side and the selected area diffraction pattern of the surface side were each determined under the conditions of an accelerated voltage of 120 V, a selected area region of $\phi$750 nm, a camera length of 100 cm, and an incident electron amount of 5.0 pA/cm$^2$ (on the fluorescent plate). The brightness of the selected area diffraction pattern thus obtained was converted, to obtain an intensity profile.

Figure 4:
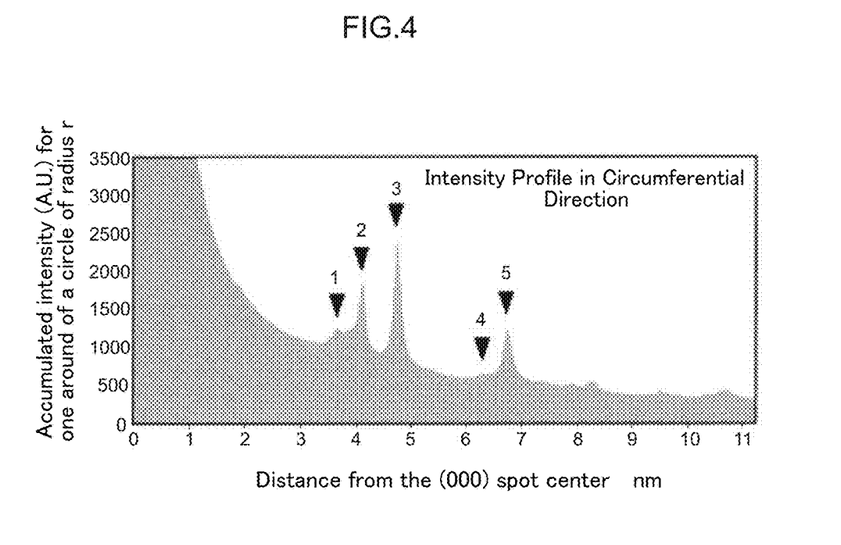
FIG. 4 is an intensity profile of the hard coating in Coated Sample 23 of the invention, the intensity profile being obtained by converting the brightness of the selected area diffraction pattern.

An example of an intensity profile of the selected area diffraction pattern with regard to the hard coating in Coated Sample 23 of the invention is shown in FIG. 4. FIG. 4 is an intensity profile of the selected area diffraction pattern, which was obtained by converting the brightness of the selected area diffraction pattern, with regard to the hard coating in Coated Sample 23 of the invention. In FIG. 4, the horizontal axis indicates the distance (radius r) from the (000) plane spot center, and the vertical axis indicates the accumulated intensity (arbitrary unit) for one round of a circle having a radius r.

In FIG. 4, arrow 1 indicates the peak from the (010) plane of AlN having an hcp structure, the peak being the maximum intensity of the AlN having an hcp structure. Arrow 2 indicates the peak from the (011) plane of AlN having an hcp structure, and the (111) plane of AlN and the (111) plane of CrN, each having an fcc structure. Arrow 3 indicates the peak from the (200) plane of AlN and the (200) plane of CrN, each having an fcc structure. Arrow 4 indicates the peak from the (110) plane of AlN having an hcp structure. Arrow 5 indicates the peak from the (220) plane of AlN and the (220) plane of CrN, each having an fcc structure.

From the intensity profile shown in FIG. 4, without eliminating the values of the background, the value of Ih×100/Is in the hard coating in Coated Sample 23 of the invention was calculated.

Here, Ih represents the intensity of the peak from the (010) plane of AlN having a hexagonal close packing structure. Further, Is represents the total of the intensities of peaks from the (111) plane of AlN, the (111) plane of CrN, the (200) plane of AlN, the (200) plane of CrN, the (220) plane of AlN, and the (220) plane of CrN, each having a face-centered cubic lattice structure, and the intensities of peaks from the (010) plane of AlN, the (011) plane of AlN, and the (110) plane of AlN, each having a hexagonal close packing structure.

As a result, with regard to the hard coating in Coated Sample 23, both the value of Ih×100/Is of the base material side and the value of Ih×100/Is of the surface side in the machined cross section of the hard coating were 17.

In contrast, with regard to the hard coating in Coated Sample 33 of Comparative Example 26, the intensity of the peak of the AlN having an hcp structure was greater as compared with the coated samples of the invention, and both the value of Ih×100/Is of the base material side and the value of Ih×100/Is of the surface side in the machined cross section of the hard coating were 28.

In Example 2, with regard to all the hard coatings in the coated samples of the invention and the coated samples of the comparative examples, the intensity of the peak from the AlN having an hcp structure was not detected by X-ray diffraction.

Thus, in order to quantitatively evaluate the AlN having an hcp structure, which exists at a micro level that cannot be detected by X-ray diffraction, it is effective to apply the intensity profile obtained from the selected area diffraction pattern.

The hard coatings in Coated Samples 20 to 26 of the invention all satisfied the relationship Ih×100/Is≤25. The hard coatings in Coated Samples 27, 28, and 35 of Comparative Examples 20, 21, and 28 satisfied the relationship Ih×100/Is≤25, since the cathode voltage was set as high as 32 V and the negative bias voltage to be applied to the base material was from −200 V to −100 V. Meanwhile, in the hard coatings in Coated Samples 29 and 30 of Comparative Examples 22 and 23, since the negative bias voltage to be applied to the base material was set at −50 V, the value of Ih×100/Is exhibited a value greater than 25. In the hard coatings in Coated Samples 31, 32, and 34 of Comparative Examples 24, 25, and 27, since the cathode voltage was as low as 21 V, the value of Ih×100/Is exhibited a value greater than 25. Particularly, in Coated Sample 31 of Comparative Example 24, in which the bias voltage to be applied to the base material was set at −50 V, the value of Ih×100/Is exhibited the maximum value.

Example 3

In Example 2, Ti$_{75}$Si$_{25}$N (the numerical value represents the atomic percentage (at. %)) having a thickness of about 1.0 μm was coated, as a protective coating of the hard coating in Coated Sample 23 of the invention and Coated Sample 33 of Comparative Example 26, thereby preparing a coated sample of Example 30 and a coated sample of Comparative Example 30. With regard to the coated samples (coated cutting tools) thus prepared, a cutting test was conducted under the cutting conditions shown below. The cutting test results are shown in Table 5. Details on the cutting conditions are as follows.

<Cutting Conditions>
Machining method: wet machining
Tool: cemented carbide two-flute ball end mill
Model number: EPDBE2010-6, ball radius 0.5 mm, length under head 6 mm
Cutting method: bottom face cutting
Workpiece: STAVAX (52HRC) (manufactured by UDDEHOLM KK)
Depth of cutting: 0.04 mm in the axial direction and 0.04 mm in the radial direction
Cutting speed: 78.5 m/min
Feed amount per one edge: 0.0189 mm/edge
Cutting oil: water-soluble emulsion, supply under pressure
Cutting distance: 60 m
Evaluation method: after cut processing, the coated sample was observed using a scanning electron microscope at a magnification of 150, and the width of abrasion caused by the coated sample and the workpiece was measured. Among the measured values, the portion having the largest abrasion width was determined as the maximum abrasion width. A smaller value of maximum abrasion width indicates more excellent durability.

TABLE 5

| | Hard Coating Film (at. %) | Protective Coating Film Having a Composition Different from that of Hard Coating Film (at. %) | Cutting Test Presence of Peeling, or Maximum Abrasion Width (μm) |
|---|---|---|---|
| Example 30 | (Al55Cr39Si6)N | Ti75Si25N | 2 |
| Comparative Example 30 | (Al54Cr40Si6)N | Ti75Si25N | Film Peeling |

As shown in Table 5, the coated sample of Example 30, which was provided with a TiSiN coating as the protective coating having a composition different from that of the hard coating, showed a stable damage form with respect to abrasion and exhibited excellent durability. In contrast, in the coated sample of Comparative Example 30, since the ratio (B/A) of nitrogen to the metal elements was lower than 1.03, even though a TiSiN coating was provided as the protective coating, the coated sample did not show a stable damage form with respect to abrasion like the coated sample of the invention, and a large film peeling occurred.

The disclosure of Japanese Patent Application No. 2014-055563 is incorporated by reference herein in its entirety.

All publications, patent applications, and technical standards mentioned in this specification are herein incorporated by reference to the same extent as if such individual publication, patent application, or technical standard was specifically and individually indicated to be incorporated by reference.

The invention claimed is:

1. A coated cutting tool, comprising a base material and a hard coating disposed on a surface of the base material, wherein:
the hard coating is formed from a nitride having an aluminum (Al) content of from 50 at. % to 68 at. %, a chromium (Cr) content of from 20 at. % to 46 at. %, and a silicon (Si) content of from 4 at. % to 15 at. %, with respect to a total amount of metal (including semimetal) elements, and, as inevitable elements, oxygen and carbon, and when a total of metal (including semimetal) elements, nitrogen, oxygen, and carbon is designated as 100 at. %, an oxygen content is from 0.2 at. % to 3.0 at. %, and a carbon content is from 0.2 at. % to 5.0 at. %, and when a total of metal (including semimetal) elements, nitrogen, oxygen, and carbon is designated as 100 at. %, an atomic percentage (at. %) A of metal (including semimetal) elements and an atomic percentage (at. %) B of nitrogen satisfy the relationship 1.03<B/A<1.07; and
in an intensity profile obtained from an X-ray diffraction pattern or a selected area diffraction pattern of a transmission electron microscope, an intensity of a peak from a (200) plane or a (111) plane of a face-centered cubic lattice structure exhibits a maximum intensity.

2. The coated cutting tool according to claim 1, wherein, in an intensity profile obtained from a selected area diffraction pattern of a transmission electron microscope, the hard coating satisfies the relationship Ih×100/Is≤25, wherein Ih represents an intensity of a peak from a (010) plane of AlN having a hexagonal close packing structure, and Is represents a total of intensities of peaks from a (111) plane of AN, a (111) plane of CrN, a (200) plane of AlN, a (200) plane of CrN, a (220) plane of AN, and a (220) plane of CrN, each having a face-centered cubic lattice structure, and intensities of peaks from a (010) plane of AlN, a (011) plane of AlN, and a (110) plane of AlN, each having a hexagonal close packing structure.

3. The coated cutting tool according to claim 2, wherein, in the hard coating, a content of one or more elements selected from the group consisting of metal elements belonging to Group 4, Group 5, and Group 6 (excluding Cr) of the Periodic Table and boron (B) is 15 at. % or lower with respect to a total amount of metal (including semimetal) elements.

4. The coated cutting tool according to claim 3, wherein the hard coating has a nanoindentation hardness of from 40 GPa to 55 GPa.

5. The coated cutting tool according to claim 3, comprising a protective coating on the hard coating disposed on the base material, the protective coating being formed from a nitride and having a different composition from the hard coating.

6. The coated cutting tool according to claim 5, wherein the hard coating has a nanoindentation hardness of from 40 GPa to 55 GPa.

7. The coated cutting tool according to claim 5, wherein the protective coating, which is formed from a nitride and has a different composition from the hard coating, is a film formed from a nitride in which a Ti content is 50 at. % or higher and an Si content is from 1 at. % to 30 at. % with respect to a total amount of metal (including semimetal) elements.

8. The coated cutting tool according to claim 7, wherein the hard coating has a nanoindentation hardness of from 40 GPa to 55 GPa.

9. The coated cutting tool according to claim 1, wherein, in the hard coating, a content of one or more elements selected from the group consisting of metal elements belonging to Group 4, Group 5, and Group 6 (excluding Cr) of the Periodic Table and boron (B) is 15 at. % or lower with respect to a total amount of metal (including semimetal) elements.

10. The coated cutting tool according to claim 1, comprising a protective coating on the hard coating disposed on the base material, the protective coating being formed from a nitride or a carbonitride and having a different composition from the hard coating.

11. The coated cutting tool according to claim 10, wherein the protective coating, which is formed from a nitride or a carbonitride and has a different composition from the hard coating, is a film formed from a nitride or a carbonitride in which a Ti content is 50 at. % or higher and an Si content is from 1 at. % to 30 at. % with respect to a total amount of metal (including semimetal) elements.

12. The coated cutting tool according to claim 1, wherein the hard coating has a nanoindentation hardness of from 40 GPa to 55 GPa.

13. A method for producing a coated cutting tool, the method comprising forming a hard coating on a surface of a base material by:

mounting, on a cathode, an alloy target having an aluminum (Al) content of from 55 at. % to 70 at. %, a chromium (Cr) content of from 20 at. % to 35 at. %, and a silicon (Si) content of from 7 at. % to 20 at. %, with respect to a total amount of metal (including semimetal) elements; and coating a nitride on the surface of the base material in accordance with an arc ion plating method wherein nitrogen gas is introduced into a furnace at a time of film formation and coating of a hard coating is performed while adjusting the gas pressure inside the furnace to fall within the range of from 3 Pa to 10 Pa, under conditions including a bias voltage applied to the base material of from −220 V to −60 V and a cathode voltage of from 22 V to 27 V, or under conditions including a bias voltage applied to the base material of from −120 V to −60 V and a cathode voltage of from 28 V to 32 V, to form a nitride having an aluminum (Al) content of from 50 at. % to 68 at. %, a chromium (Cr) content of from 20 at. % to 46 at. %, and a silicon (Si) content of from 4 at. % to 15 at. %, with respect to a total amount of metal (including semimetal) elements, and when a total of metal (including semimetal) elements, nitrogen, oxygen, and carbon is designated as 100 at. %, an atomic percentage of oxygen is in a range of from 0.2% to 3.0%, an atomic percentage of carbon is in a range of from 0.2% to 5.0%, and an atomic percentage (at. %) A of metal (including semimetal) elements and an atomic percentage (at. %) B of nitrogen satisfy the relationship $1.03 \leq B/A \leq 1.07$; and in an intensity profile obtained from an X-ray diffraction pattern or a selected area diffraction pattern of a transmission electron microscope, an intensity of a peak from a (200) plane or a (111) plane of a face-centered cubic lattice structure exhibits a maximum intensity.

* * * * *